United States Patent [19]

Ewert et al.

[11] 4,251,769
[45] Feb. 17, 1981

[54] INDICATOR AND LIMIT VALUE ALARM DEVICE

[75] Inventors: Horst Ewert, Schoeneck; Wilfried Schäel, Bad Homburg, both of Fed. Rep. of Germany

[73] Assignee: Dr. Eduard Fresenius Chemisch-pharmazeutische Industrie KG, Apparatebau KG, Bad Homburg, Fed. Rep. of Germany

[21] Appl. No.: 27,496

[22] Filed: Apr. 5, 1979

[30] Foreign Application Priority Data

Apr. 14, 1978 [DE] Fed. Rep. of Germany ....... 2816302

[51] Int. Cl.³ .................. G01R 13/00; G08B 21/00
[52] U.S. Cl. ............................... 324/96; 324/103 P; 324/122; 340/511; 340/661; 340/715; 340/753
[58] Field of Search .............. 340/661, 663, 664, 657, 340/660, 662, 650, 651, 508, 511, 517, 521, 522, 715, 753, 762; 324/96, 103 P, 122, 102, 115

[56] References Cited

U.S. PATENT DOCUMENTS

| | | | |
|---|---|---|---|
| 2,593,204 | 4/1952 | Schwartzberg | 340/169 X |
| 2,705,902 | 4/1955 | Blowney | 340/380 UX |
| 3,914,758 | 10/1975 | Ingle | 324/122 |
| 3,922,640 | 11/1975 | Ruof | 340/661 X |
| 4,001,699 | 1/1977 | Denny et al. | 340/753 X |
| 4,155,084 | 5/1979 | Klees | 340/753 |
| 4,200,896 | 4/1980 | Baumann | 340/715 X |

OTHER PUBLICATIONS

"Analog Meter has LED Display", Under New Products, Electronics, Mar. 17, 1977.

*Primary Examiner*—John W. Caldwell, Sr.
*Assistant Examiner*—Daniel Myer
*Attorney, Agent, or Firm*—W. G. Fasse; D. F. Gould

[57] ABSTRACT

The present electronic indicator or display device is equipped with adjustable upper and/or lower limit value markers to provide a respective alarm if such limit values are exceeded or not reached. The display itself comprises an electronic circuit and optical display elements such as light emitting diodes connected to the display circuit. An input to the display circuit is adapted to receive rated or limit value input signals which are displayed as respective markers and the position of which is adjustable. A time multiplexing circuit controls the timed sequence of the signals supplied to the display elements. A comparator compares the measured signal value with the rated value or values and monitors the proper function of the system.

11 Claims, 4 Drawing Figures

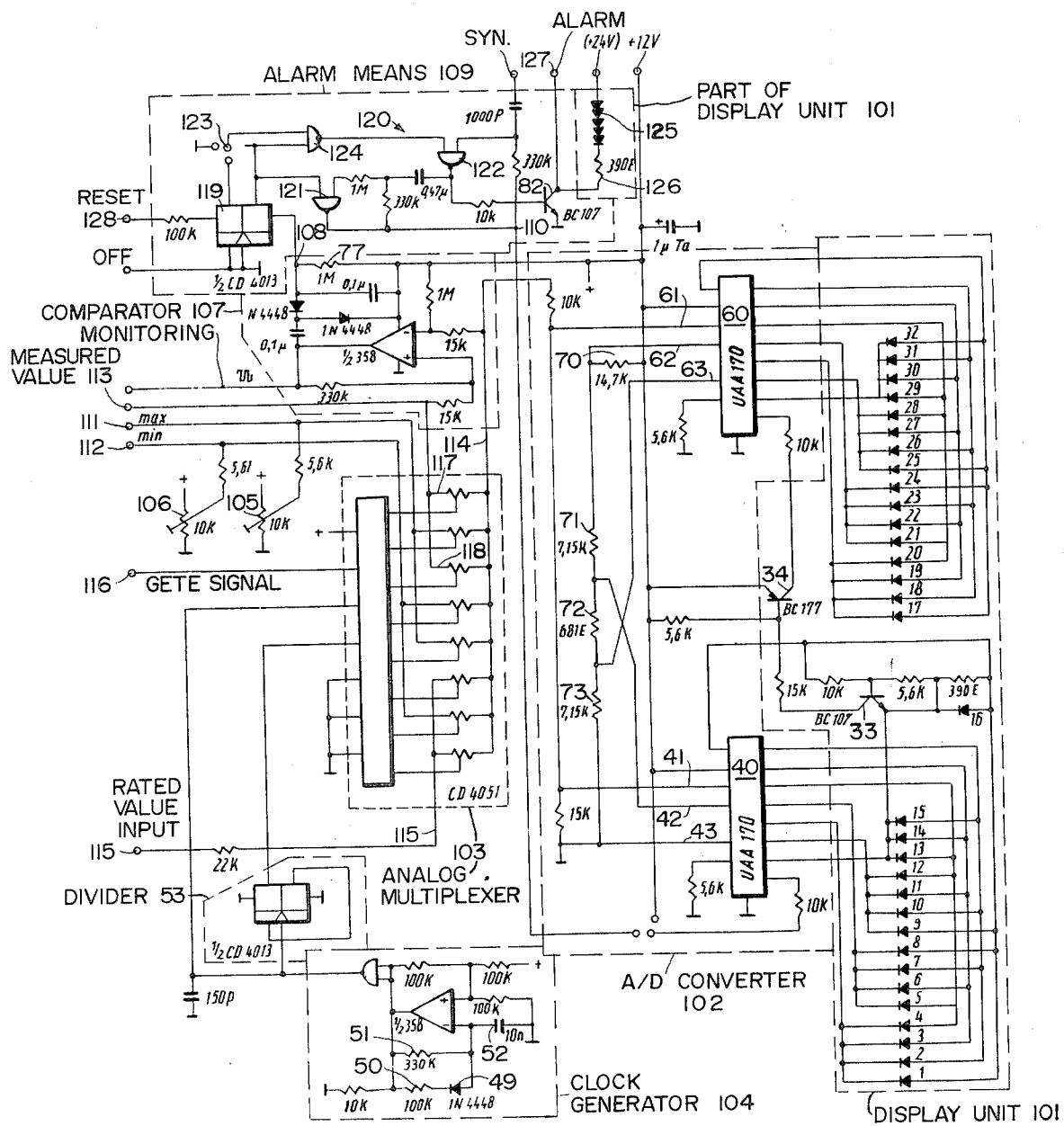

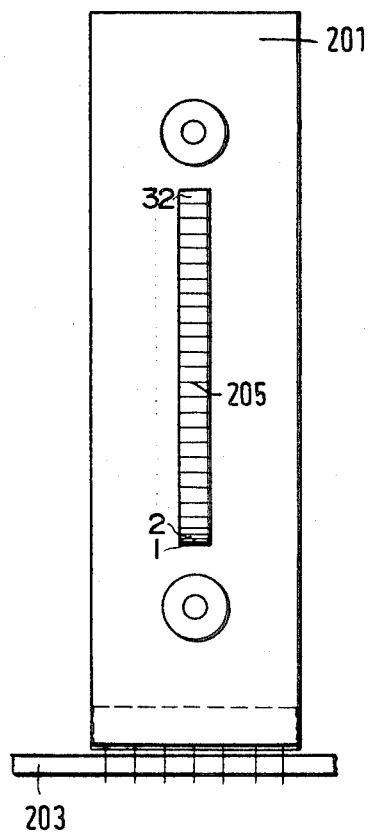
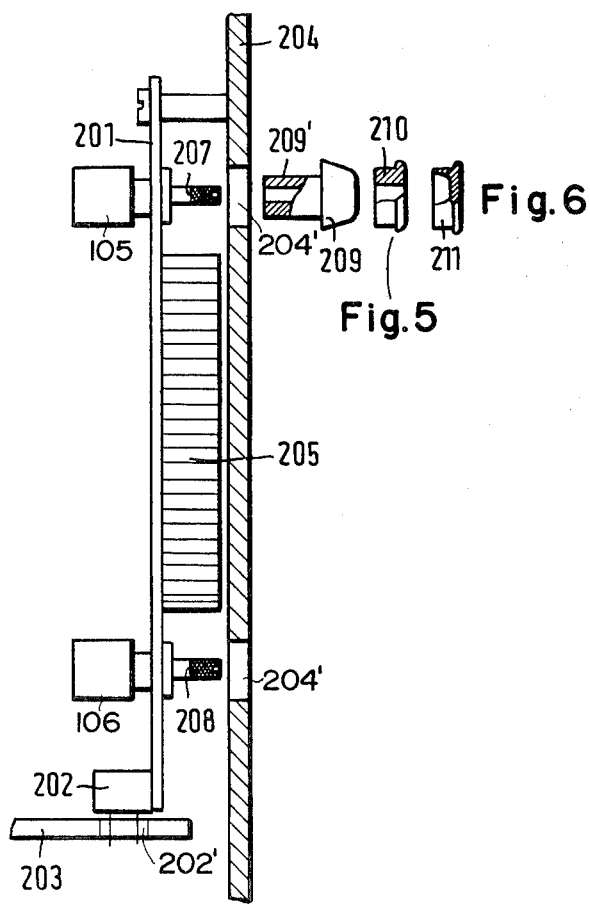

INDICATOR AND LIMIT VALUE ALARM DEVICE

BACKGROUND OF THE INVENTION

The invention relates to an indicating device including adjustable rated or limited value markers. Electrical signals are produced when the limit value markers are reached or exceeded. The actual indicating device comprises light emitting diodes, liquid crystals, or gas discharge indicator elements arranged in a row.

Electrical indicator instruments comprising adjustable limit values are known in different types. In the most common form such an indicating instrument comprises a moving coil meter and a scale. The moving coil meter is provided additionally with one or more rated value or limit value pointers which are adjustable from the outside of the instrument. The rated value or limit value pointers are mechanically coupled with sensors which trigger a switching signal as soon as the measured value pointer reaches or exceeds the position of the rated value or limit value pointer. These sensors are, for example, constructed as light barriers, the light barriers of which are either released to pass or interrupted by means of a flag connected to the measured value pointer. In another known construction each of the sensors comprise a coil pair forming part of an oscillator circuit. A flag connected with the measured value pointer interrupts the vibration of the oscillator by reducing the magnetic coupling between the coils.

It is also known to use as an indicating device light emitting diodes arranged in a row instead of a pointer instrument. The indication by means of such a light emitting diode row may be accomplished in analogy to a liquid thermometer in such a manner that the light emitting diodes are all switched on from the beginning of the scale to a certain point along the scale which represents the actually measured value while the remaining light emitting diodes are switched off to the end of the scale. Another known way of indication resides in that only one individual light emitting diode is lit, namely, the one corresponding to the actual measured value while all other light emitting diodes are switched off.

OBJECTS OF THE INVENTION

It is an object of the invention to provide an indicating device which combines the advantages of a light emitting display or indication with the characteristics of known electro-mechanical indicating instruments providing a limit value message or alarm.

SUMMARY OF THE INVENTION

According to the invention there is provided an indicator and limit value alarm device, comprising electronic circuit means including signal input means for processing input signals representing measured values, display means operatively connected to said electronic circuit means for displaying said measured values, rated value input means operatively connected to said electronic circuit means for also displaying in said display means at least one rated value as a limit value simultaneously with the display or said measured values, and alarm means operatively connected to said electronic circuit means and to said measured value input means for providing an alarm when any measured value is in an unpermissible range relative to said limit value.

BRIEF FIGURE DESCRIPTION

In order that the invention may be clearly understood, it will now be described, by way of example, with reference to the accompanying drawings, wherein:

FIG. 2 shows a complete detail circuit diagram of the indicator device of FIG. 1;

FIGS. 3 and 4 show a preferred, spacial arrangement of the functional elements of the present indicator device; and FIGS. 5 and 6 show a guide sleeve and a plug respectively.

Figure 1:
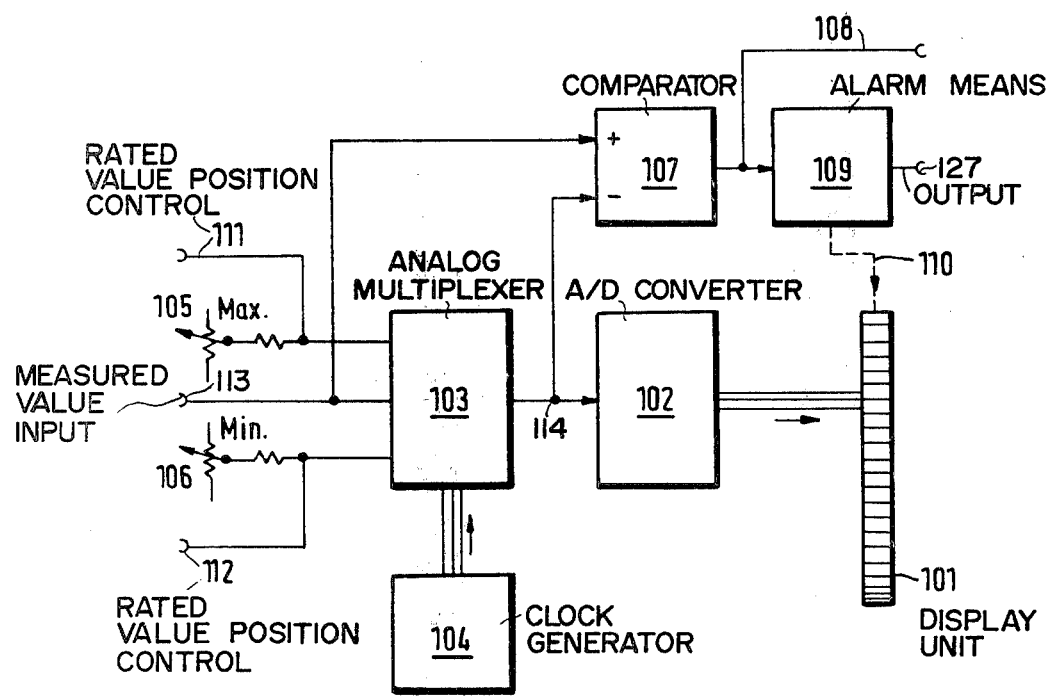
FIG. 1 shows a block circuit diagram of the present indicator device providing an upper and a lower limit value display.

DETAILED DESCRIPTION OF PREFERRED EMBODIMENTS AND OF THE BEST MODE OF THE INVENTION

The block circuit diagram of FIG. 1 illustrates the basic components and their cooperation in a preferred embodiment. The indicating or display column 101 formed of light emitting diodes or of the other mentioned types of indicating or display elements is controlled by a special analog-to-digital converter 102. This A/D-converter 102 has the characteristic to sequentially switch on the individual indicating elements connected to its outputs in response to an assumed linear time increase of the input voltage, whereby the first element is switched on first and the switching-on ends with the last element in the indicating row 101. Thus, the position of the respectively switched-on indicating element designates the value of the voltage respectively present at the input of the converter 102. Such converters are known and available among others in the form of integrated circuits. The input voltage of the converter 102 is supplied through an analog multiplexer 103. This multiplexer switches the input voltage at the measured value input 113 corresponding to the measured value and further voltages in a predetermined time sequence to the input of the analog-to-digital converter 102. In the present example, the further voltages represent the lower limit value "min" and the upper limit value "max." The multiplexer 103 is controlled by the clock generator 104 in such a manner that the duration of the switching-on of the measured value is larger than the switched-on duration of the limit values "min," "max," for example, by a factor of 2 to 5 so that the mean or average switched-on durations of the respective indicating elements result in a different output or brightness of the respective indicating element to distinguish between measured and limit values. The frequency of the clock generator is selected so high, that the brightness variations as a function of time of this clock frequency cannot be noticed by the human eye. Stated differently, the clock generator 104 provides a clock signal with a frequency higher than the resolution of the human eye. The result of these features is, that for example, three indicating elements are lit up within this time. One lit indicating element represents the measured value and is lit up with a higher brightness than the two other indicating elements representing the upper and lower limit values. Thus, it is possible to clearly distinguish the measured value from the limit values. The limit values may, for example, be provided by means of the potentiometers 105 and 106 or these values may be supplied in the form of external signals applied to the input terminals 111 and 112.

The comparator or threshold value switch 107 monitors the measured value whether it exceeds or falls below the limit values. The input voltage corresponding to the measured value and the output voltage of the multiplexer 103 are compared with each other by means of this comparator 107. If the measured value is located between the two limit values, a rectangular voltage is provided at the output 108 of the comparator 107. The rectangular voltage results, because the voltage supplied from the output of the multiplexer 103 to the negative input of the comparator 107 periodically falls below or exceeds the input voltage at the positive input of the comparator. However, as soon as the input voltage exceeds the upper limit value, a higher potential is present at the positive input of the comparator than at the negative input so that a constant positive signal appears at the comparator output 108. If the input voltage falls below the lower limit value, a lower potential is continuously present at the positive input of the comparator than at the negative input. Accordingly, a constant negative potential appears at the comparator output 108. In this manner all three states that are of interest are distinguished at the output 108 of the comparator 107, namely:

(1) "the measured value is within the limits,"
(2) "the upper limit value is exceeded," and
(3) "the lower limit value is not reached."

These informations are supplied to an alert or alarm providing unit 109 for triggering switching steps, alarm signals or the like. A special possibility for indicating an unpermissible exceeding of a limit value resides in that the indicating row or column 101 is controlled periodically light and dark whereby all indicator elements flash simultaneously. This may be accomplished by the dashed control line 110. According to another embodiment it is contemplated to have flashing only the measured value or only the respective limit value that has been exceeded or not reached. Such flashing is accomplished in that the signal which corresponds to the desired blinking rhythm is additionally logically combined with the output signals of the clock generator 104 for periodically suppressing the indication or display.

The described type of monitoring the limit value has the advantage that the function of the clock generator 104, of the multiplexer 103 and of the comparator 107 is continuously and automatically controlled or rather monitored. As long as the measured value is between the adjusted limit values, the rectangular voltage occurs at the output 108 of the comparator 107, thereby indicating the normal condition. The comparator output 108 takes up one of its extreme positions, when the limit value is exceeded, whereby an alarm is triggered. The same situation occurs when either the clock generator 104, or the multiplexer 103, or the comparator 107 stops to function and an alarm is also triggered to draw attention to the malfunction. Thus, failures of these circuit are automatically recognized, which is especially important in indicating instruments used for monitoring purposes.

A conventional circuit arrangement for monitoring a voltage to see whether it falls below a preselected minimum value or whether it exceeds a maximum value, comprises two comparators which together form a so-called window or aperture comparator. Such a circuit arrangement may be used in the present context. However, an aperture comparator has the disadvantage that it does not provide the described automatic monitoring of the proper function of the circuit components.

In the circuit arrangement according to FIG. 1 it is possible to vary the position of the two limit values "min" and "max" by means of externally provided voltages applied to the inputs 111 and 112. This feature is advantageous, for example, when the invention is used in devices or equipments which are switched to different types of operation requiring a correspondingly automatic adaptation of the limit values to the changed operating conditions. The measured value signal is applied to input 113.

A detailed circuit diagram of an indicating device with means for limit value monitoring according to the block circuit diagram of FIG. 1 is shown in FIG. 2. The measured value scale or column 101 comprises, for example, a plurality of light emitting diodes numbered from 1 to 32 arranged vertically in a row or column. The light emitting diodes are addressed or controlled by two integrated circuits 40 and 60 forming part of the A/D-converter 102. The light emitting diodes 1 to 16 are addressed by the integrated circuit 40. The light emitting diodes 17 to 32 are addressed by the integrated circuit 60. A control voltage present at the input terminal 41 or 61 of the integrated circuit 40, 60 lights up only the respective one of the sixteen light emitting diodes which are arranged in a four by four matrix. The indicating range is determined by the voltages present at the terminals 42, 43 and 62, 63.

The range resistors 70, 71, 72, and 73 allocate 50% respectively of the entire indicating range, to the two integrated A/D-converter circuits 40 and 60. Thus, the integrated circuit 40 operates within the range of 0 volts to +5 volts and the integrated circuit 70 operates in the range of +5 to +10 volts. If the measuring range of an integrated circuit is not reached or exceeded, the respective lowest or uppermost light emitting diode is continuously lit. For this reason the light emitting diode 16 is covered up and the integrated circuit 60 is controlled for the lit up condition only if the range of the integrated circuit 40 is exceeded. Said control is accomplished by the light emitting diode 16 through the transistors 33 and 34. The two limit values "max" and "min" which are adjustable by means of the potentiometers 105 and 106 respectively, are superimposed or gated into the A/D-converter 102 by means of the integrated circuit time multiplexer 103 in a time multiplex fashion. The integrated circuit time multiplexer 103 is a binary coded eight channel analog switch which is addressed or controlled by the free running square wave generator integrated circuit clock generator 104 comprising the frequency determining elements 50, 51, and 52, as well as by the following binary divider integrated circuit 53 to provide a 4-phase clocking of the multiplexer 103. Divider 53 includes a flip-flop circuit.

By means of this addressing or control of the multiplexer 103, the channel inputs 111, 112, 113 of the multiplexer 103 are sequentially connected to the common multiplexer output 114. Instead of the measured value at input 113, it is possible to gate or superimpose a rated value present at the input 115 into the multiplexer 103, if a respective gate signal is present at the external terminal 116 for activating the channel inputs 111, 112, plus 115 of the analog switch or multiplexer 103, said gate signal being a low level (L-level) signal.

Since the measured value is present at two channels 117 and 118, it is scanned twice as often as each limit value "min" and "max." Therefore, the measured value appears brighter in the display unit 101 and this appearance is further enhanced by the nonsymmetric impulsepause-ratio of the square wave clock generator 104 which is also an integrated circuit. The frequency determining resistor 50 is effective only during the pause time through the diode 49.

The comparator integrated circuit 107 compares the level at the output 114 of the analog switch with the measured value present at the multiplexer input 113. If the measured value is within the two limit values "min" and "max," a square wave signal appears at the output 108 of the comparator 107. If the measured signal falls below the lower limit value "min," a low level signal (L-level) appears at the comparator output 108. If the measured signal exceeds the upper limit value "max," a high level signal (H-level) appears at the comparator output 108.

The rectified and filtered output signal of the comparator 107 prevents the setting of the alarm flip-flop 119. If the output signal is absent at the comparator output 108, the alarm flip-flop 119 is set by the H-level signal through the resistor 77 to thereby start the blinking or flashing generator 120 comprising the gates 121 and 122. This blinker generator 120 may also be programmed to cause a continuous light, by means of the soldering terminal 123 at the input of the gate 124.

The blinking or flashing impulses open or the H-level signal at the output of the gate 122 opens the transistor 82 through the resistor 83 so that the red light emitting diodes 125 forming part of the display 101 and connected through a resistor 126 to the collector of the transistor 82, are energized. In parallel to energizing the red light emitting diodes 125, a low level signal is supplied at the alarm output terminal 127 for further alarm processing, for example, sounding an alarm. The alarm flip-flop 119 may be reset by means of a high level signal at the reset terminal 128.

FIGS. 3 and 4 show a preferred mechanical arrangement of the components of the present apparatus. The electronic components and the indicator elements 1 to 32 are arranged in the form of a printed circuit on a suitable support plate 201. The support plate may, for example, be plugged onto a chassis or a base plate 203, by means of a plug strip 202 and a respective socket strip 202'.

The indicating elements, such as the light emitting diodes 1 to 32 are located in a row or column 205 on that side of the support plate 201 facing the front plate 204. The actuator axis 207 of the potentiometers 105 and the actuator axis 208 of the potentiometer 106 face the front plate 204 for adjusting the lower and upper limit values "min" and "max." The remaining components which are also arranged on the support plate 201 have not been shown in FIGS. 3 and 4 for clarity's sake. The front plate 204 is provided with bores 204' in register with the position of these actuating axes 207, 208 which are thus accessible from the outside of the front plate 204. The axes 207 and 208 end, however, short of the inner surface of the front plate 204 in order to make possible the free insertion and withdrawal of the support plate 201 and thus of the entire indicating device.

As shown in FIGS. 4, 5, and 6 there are several possibilities for providing access to the potentiometer axes or shafts 207, 208. The first possibility resides in that a turning knob 209 having a slotted bushing 209' is stuck onto the shaft 207, 208 whereby the bushing 209' elastically grips the actuating shaft for the manual adjustment of the potentiometer. If the adjustment shall be possible only with the aid of a tool such as a wrench or screwdriver, a guide sleeve 210 may be inserted into the bore 204' in the front plate 204 instead of the turning knob. If an external adjustment is not intended at all, for example, where an automatic control of the limit values is provided by respective signals at the terminals 111, 112 of the apparatus, the bore in the front plate is closed by a plug 211.

The present device is substantially insensitive to mechanical shocks, and such shocks normally do not trigger a false alarm. The device is not influenced by magnetic fields or ferromagnetic materials in its vicinity and mechanical wear and tear is minimized.

The described structure is flat and compact due to using a printed circuit which also makes its production simple and inexpensive, especially since there is no precision requirement as is the case in mechanical pointer instruments. The printed circuit techniques are well adapted to producing but a small number of circuits as well as to mass production. Depending on the type of display elements used these may be self-illuminating and visible in the dark. Rated or limit values may be set by remote control and additional information may be signalled, for example, in the case of an alarm by flashing the actual measured value markers and/or of the rated or limit value markers. The comparator provides an automatic, for example, periodic testing of the operability of the limit value signal triggering which is possible in mechanical instruments only by manually displacing the limit value pointers.

As compared to pointer instruments, the present display device is not sensitive to position, it will operate in any position. The present device may be manufactured by mass production techniques. Whereas in conventional pointer instruments, for example, of the moving coil type, it is necessary to employ experienced, trained workers as well as expensive auxiliary equipment for the assembly and adjusting.

Although the invention has been described with reference to specific example embodiments, it is to be appreciated, that it is intended to cover all modifications and equivalents within the scope of the appended claims.

What is claimed is:

1. An indicator and limit value alarm circuit arrangement, comprising analog multiplexing means (103) including input means (105, 106; 111, 112, 113) for supplying input values including measured value representing signals, rated value representing signals, and limit value representing signals to said analog multiplexing means (103), clock generator means (104) operatively connected to said analog multiplexing means (103) for sequentially processing said signals through said analog multiplexing means, said clock generator means providing a clock signal having a clock frequency above the resolution of the human eye, display means (101) comprising a plurality of display elements arranged in a row, analog-to-digital converter means (101) operatively interconnecting said display means to said analog multiplexing means whereby any one of said display elements may be energized sequentially, said clock frequency assuring a simultaneous display to the observer, said clock generator means controlling said analog multiplexing means in such a manner that the switched-on durations differ for different input values for distinguishing said different input values on said display means by the different brightnesses resulting from said different switched-on durations.

2. The circuit arrangement of claim 1, further comprising alarm means operatively connected to said analog multiplexing means (103) and to said measured value input means (113) for providing an alarm signal.

3. The circuit arrangement of claim 2, further comprising comparator circuit means (107) connected to said alarm means, said comparator circuit means (107) having a first input for receiving said measured value representing signals from the respective input means and a second input for receiving said limit value representing signals from said analog multiplexing means, whereby the functioning of the clock generator means (104), of the analog multiplexing means and of the comparator circuit means is continuously monitored.

4. The circuit arrangement of claim 3, wherein said comparator circuit means provides an alarm output signal when a measured value representing signal exceeds or falls below said limit value.

5. The circuit arrangement of claim 3, wherein said alarm means comprise alarm signal circuit means operatively connected to said comparator circuit means and alarm display means operatively connected to said alarm signal circuit means for providing an alarm in response to a specific output signal from said comparator circuit means.

6. The circuit arrangement of claim 2, wherein said alarm means comprise alarm signal producing means and signal memory means operatively connected to said alarm signal producing means.

7. The circuit arrangement of claim 2, wherein said alarm means comprise flashing signal circuit means operatively connected to said display means for controlling the energizing of at least one of said display elements.

8. The circuit arrangement of claim 2, wherein said display means comprise at least one alarm signal element, and wherein said alarm means comprise alarm signal generator means operatively connected to said alarm signal element for controlling said alarm signal element in response to the measured value falling below or exceeding said limit value.

9. The circuit arrangement of claim 1, wherein said input means for said limit value representing signals comprise means for adjusting said limit value.

10. The circuit arrangement of claim 1, wherein said display means comprise a plurality of light emitting diodes arranged in a row or column to form a display unit.

11. The circuit arrangement of claim 1, wherein said display means comprise additional optical display elements for signifying special conditions.

* * * * *